US006934005B2

(12) United States Patent
Roux et al.

(10) Patent No.: US 6,934,005 B2
(45) Date of Patent: Aug. 23, 2005

(54) RETICLE FOCUS MEASUREMENT METHOD USING MULTIPLE INTERFEROMETRIC BEAMS

(75) Inventors: Stephen Roux, New Fairfield, CT (US); Todd J. Bednarek, Southbury, CT (US)

(73) Assignee: ASML Holding N.V., Veldhoven (NL)

( * ) Notice: Subject to any disclaimer, the term of this patent is extended or adjusted under 35 U.S.C. 154(b) by 174 days.

(21) Appl. No.: 10/235,499

(22) Filed: Sep. 6, 2002

(65) Prior Publication Data

US 2004/0048400 A1 Mar. 11, 2004

(51) Int. Cl.[7] .............................................. G01B 27/42
(52) U.S. Cl. ....................................................... 355/53
(58) Field of Search ..................... 355/53, 68; 356/498, 356/450; 430/22

(56) References Cited

U.S. PATENT DOCUMENTS

| 6,331,885 B1 | * 12/2001 | Nishi ........................... 355/53 |
| 6,359,678 B1 | 3/2002 | Ota |
| 6,406,820 B1 | 6/2002 | Ota |

FOREIGN PATENT DOCUMENTS

| EP | 1160629 | 12/2001 |
| WO | WO2004/012245 | 2/2004 |

OTHER PUBLICATIONS

Copy of Australian Search Report for European Appln. 200305649–6 mailed Aug. 19, 2004.

English Language Abstract of JP 11–307436 dated Nov. 5, 1999.

English Language Abstract of JP 10–335234 dated Dec. 18, 1999.

* cited by examiner

*Primary Examiner*—John F. Niebling
*Assistant Examiner*—Andre' Stevenson
(74) *Attorney, Agent, or Firm*—Sterne, Kessler, Goldstein & Fox P.L.L.C.

(57) ABSTRACT

A first set of interferometric measuring beams is used to determine a location of a patterned surface of a reticle and a reticle focus plane for a reticle that is back clamped to a reticle stage. A second set of interferometric measuring beams is used to determine a map of locations of the reticle stage during scanning in a Y direction. The two sets of interferometric measuring beams are correlated to relate the reticle focal plane to the map of the reticle stage. The information is used to control the reticle stage during exposure of a pattern on the patterned surface of the reticle onto a wafer.

19 Claims, 10 Drawing Sheets

RETICLE FOCUS MEASUREMENT METHOD USING MULTIPLE INTERFEROMETRIC BEAMS

BACKGROUND OF THE INVENTION

1. Field of the Invention

The present invention relates to controlling a reticle stage during exposure.

2. Background Art

Figure 1:
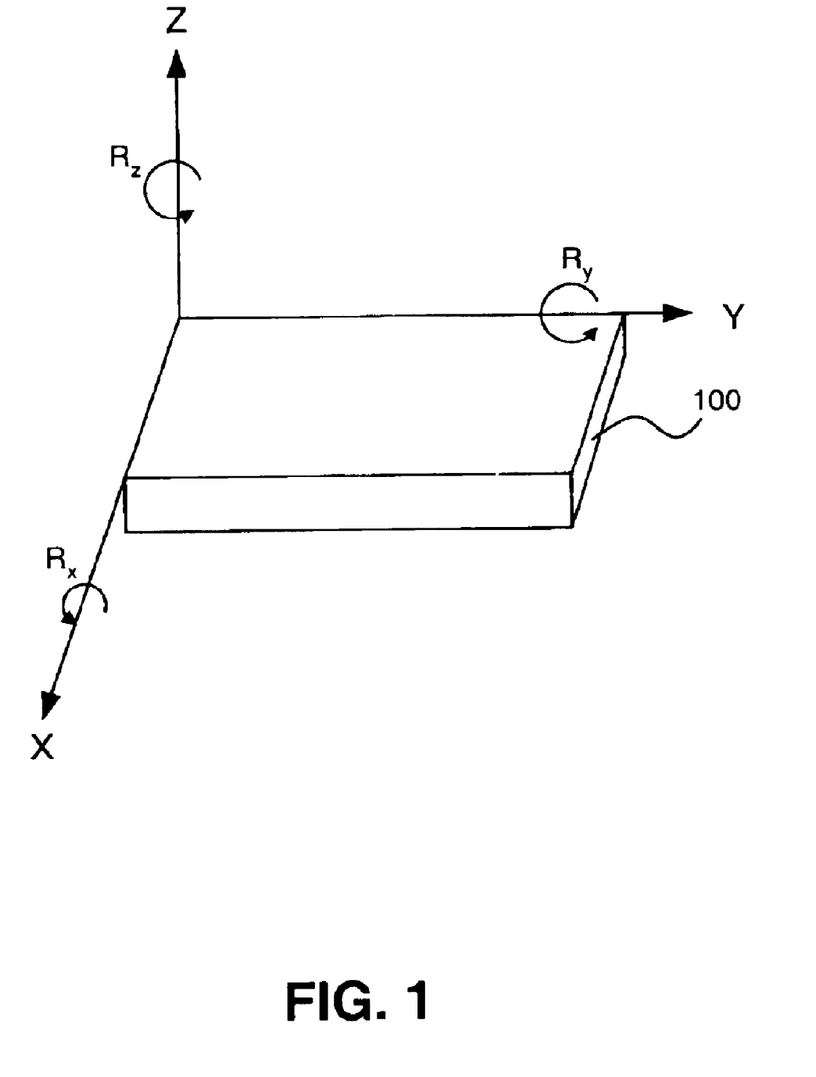
FIG. 1 shows an example orientation of a reticle according to embodiments of the present invention.

Historically, in lithographic tools a mounting side and a patterned side of a reticle are one and the same, establishing a reticle focal plane at a plane of a reticle stage platen. Thus, knowledge of stage position in six degrees-of-freedom (DOF) resulted in knowledge of the reticle patterned surface position in six DOF. The six DOF are X, Y, Z, Rx, Ry, and Rz, as shown in FIG. 1. However, mounting (or clamping) of an extreme ultra violet (EUV) reticle will almost certainly be to a back surface of the reticle (e.g., opposite from the patterned surface). Backside clamping results in a reticle focal plane position relative to the reticle stage that is a function of reticle flatness, reticle thickness, and reticle thickness variation. Thus, in contrast to deep ultra violet (DUV) systems, knowledge of the reticle stage position does not resolve where the pattern of the reticle is located in all six DOF. The out-of-plane DOF (Z, Rx, and Ry) cannot be easily determined due to the thickness variation of the reticle. The position of the patterned side (opposite to the clamped side) of the reticle needs to be known accurately in all six DOF.

In almost all steppers and scanners three in-plane DOF (X, Y, and Rz) are determined from typical stage metrology schemes using interferometers. However, three out-of-plane DOF (Z, Ry, and Rx) are more difficult to measure. As discussed above, in an EUV tool, Z, Rx, and Ry have to be known with much higher accuracy than in previous lithography tools. The accuracy requirement stems from the need to position the pattern on the reticle at a focal plane related to optics of the lithography tool. Also, in some cases, optics are not telecentric at the reticle focal plane, which increases the need for accuratley determining the reticle position on the reticle stage to within six DOF. At the same time, it is critical to accurately maintain focus on the pattern on the reticle even though the reticle is not perfectly flat. Therefore, measuring the Z position and the out of plane tilts (Rx and Ry) of the patterned side of the reticle in the EUV tool requires tight accuracy.

Therefore, what is needed is a measuring system and method that can easily calibrate or correlate a reticle focal plane (for a backside clamped reticle) to a reticle stage to allow tracking of a patterned surface of a reticle's position in six DOF using reasonably conventional stage metrology methods. A measuring system and method is also needed that maps a reticle surface to surfaces on a reticle stage, which allows feedback for stage position to be based on surfaces on the stage instead of surfaces on the reticle surface.

BRIEF SUMMARY OF THE INVENTION

Embodiments of the present invention provide a method including the steps of measuring location data of a pattern side of a reticle based on a first set of interferometer measuring beams, measuring map data of a reticle stage during scanning of the reticle stage based on a second set of interferometer measuring beams, and controlling the reticle stage during exposure of a wafer with a pattern on the pattern side of the reticle based on the location data and the map data.

Further embodiments of the present invention provide a method that includes the steps of determining a reticle focal plane of a backside clamped reticle on a reticle stage using a first interferometer, determining positions of the reticle stage during scanning, of the reticle stage using a second interferometer, correlating the reticle focal plane to the positions of the reticle stage, and controlling the reticle stage during an exposure process based on the correlating step.

Still further embodiments of the present invention provide a system including a moveable reticle stage holding a reticle, the reticle having a patterned side, a dual interferometer device that projects and detects a first set of interferometer beams from the patterned side of the reticle and a second set of interferometer beams from the reticle stage, and a storage device that stores location data of the reticle measured by the first set of interferometer beams and map data of the reticle stage measured by the second set of interferometer beams.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

A first set of interferometric measuring beams is used to determine a location of a patterned surface of a reticle and a reticle focus plane for a reticle that is clamped (e.g., back, side, or front clamped) to a reticle stage. A second set of interferometric measuring beams is used to determine a map of locations of the reticle stage during scanning in a Y direction. The two sets of interferometric measuring beams are correlated to relate the reticle focal plane to the map of the reticle stage. The information is used to control the reticle stage during exposure of a pattern on the patterned surface of the reticle onto a wafer.

FIG. 1 shows six degrees of freedom (DOF) for a reticle 100 oriented in or parallel to an X-Y plane according to embodiments of the present invention. Again, the six DOF are X (along the X axis), Y (along the Y axis), Z (along the Z axis), Rx (rotation around the X axis), Ry (rotation around the Y axis), and Rz (rotation around the Z axis). The more easily determinable DOF are the X, Y, and Rz based on a reticle stage's movements. In the embodiments discussed below, the DOF that are the focus of the discussion below are Z and Ry. It is to be appreciated that any DOF can be determined by the appatarus and methods below if the orientation of the reticle 100 is changed.

Figure 2A:
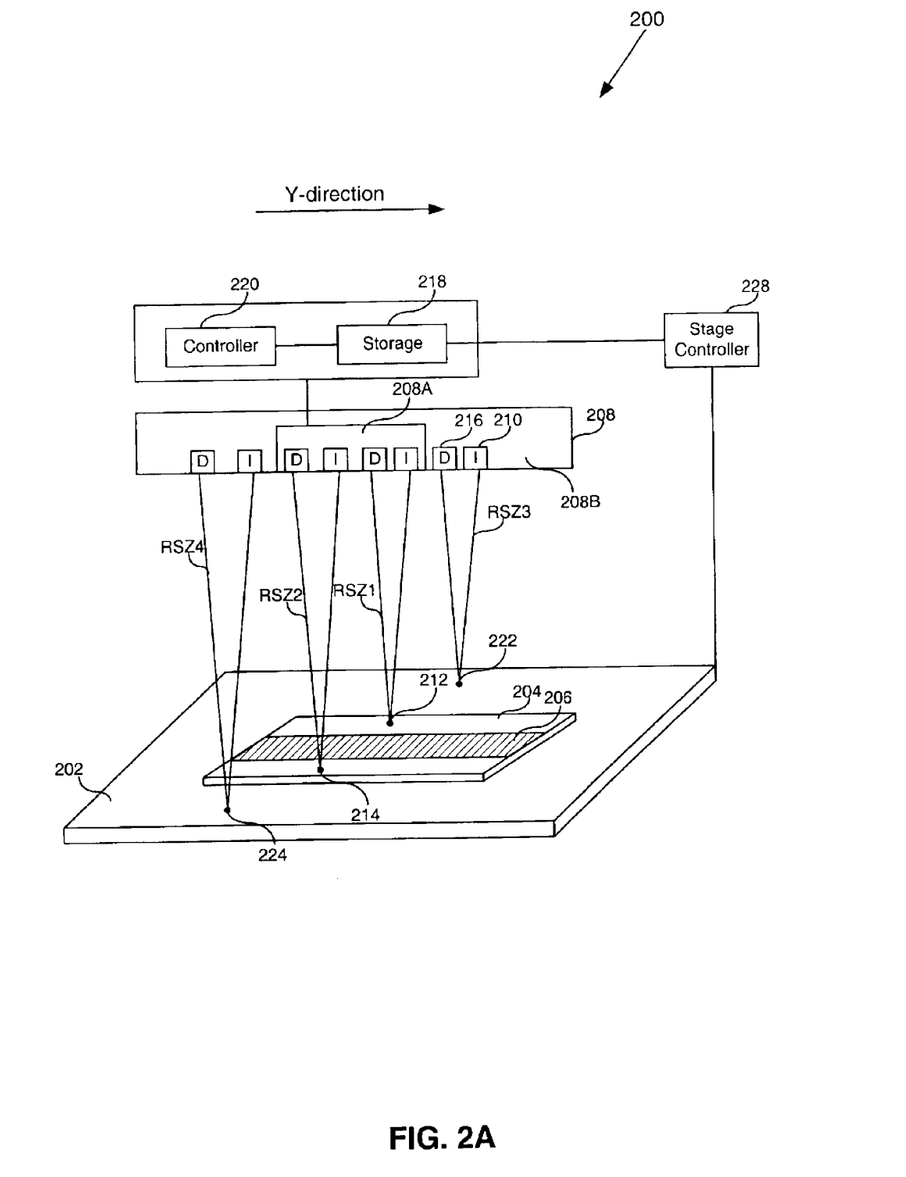
FIG. 2A shows a portion of a lithographic system or tool using a dual interferometer according to embodiments of the present invention.

FIG. 2A shows a portion 200 of a lithography tool according to embodiments of the present invention. Portion 200 includes a reticle stage 202 with a backside clamped reticle 204 that has a pattern 206. Although not drawn to scale, an interferometer system 208 includes two interferometers 208A and 208B. Each interferometer 208A and 208B projects illuminating (I) light from illumination devices 210 towards portion 200. In various embodiments, illumination devices 210 can be light sources, lasers, or the like with or without focusing or expanding optical devices. A first set of interferometric measuring beams RSZ1 and RSZ2 from first interferometer 208A are reflected from first 212 and second 214 positions, respectively, on reticle 204. First position 212 is adjacent a first side of pattern 206 and second position 214 is adjacent a second side of pattern 206. The reflected beams are received by detectors (D) 216. Signals corresponding to the detected beams are stored in a storage device 218 either before or after being processed by controller 220.

Again with reference to FIG. 2A, similarly, a second set of interferometric measuring beams RSZ3 and RSZ4 from second interferometer 208B are reflected from first 222 and second 224 points, respectively, on reticle stage 202 and detected by detectors 216. Signals correlating to the detected beams are then stored in storage 218. In the embodiments shown and described above, all four measuring points, 212, 214, 222, and 224 substantially lie along a line having a same Y value. In other embodiments this may be required.

Figure 2B:
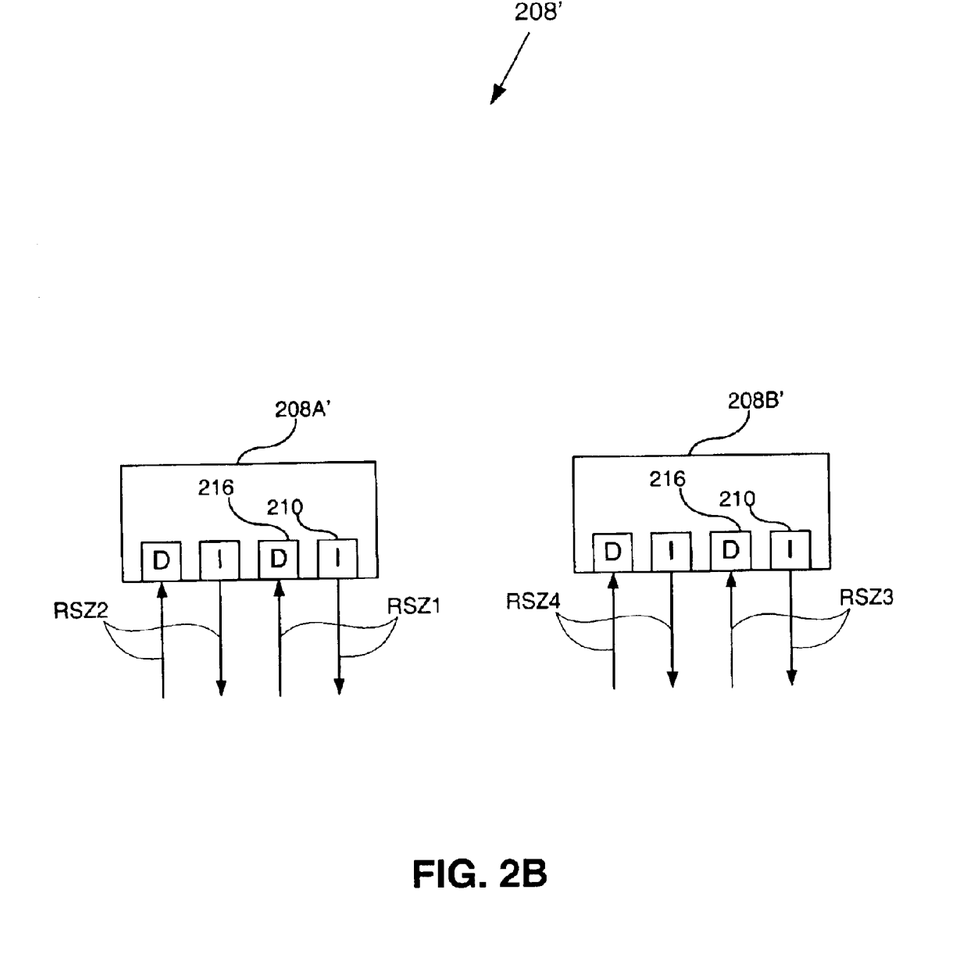
FIG. 2B shows a portion of a lithographic system using two interferometers according to embodiments of the present invention.

FIG. 2B shows an interferometer 208' including a first interferometer 208A' and a second interferometer 208B' according to embodiments of the present invention.

Figure 3A:
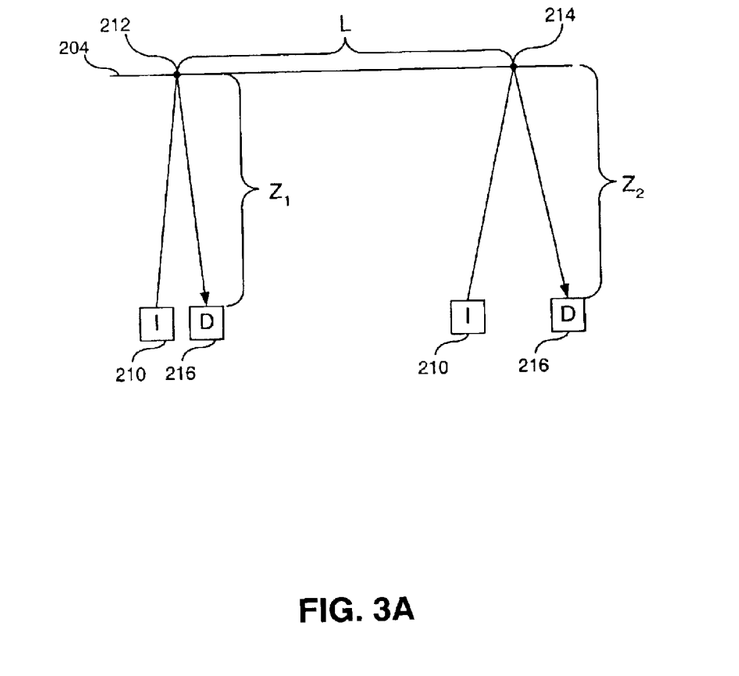
FIGS. 3A and 3B show various configurations of a reticle and a stage being measured according to various embodiments of the present invention.
Figure 3B:
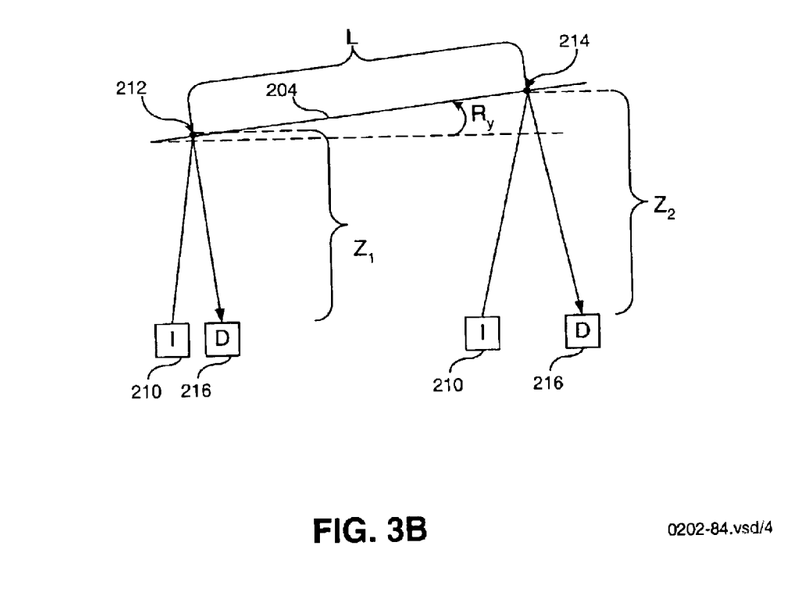

FIGS. 3A and 3B show a first and second posisble position of reticle 204 according to embodiments of the present invention. To calcuale the Z and Ry values, interferometric techniques are performed by the interferometer system 208 or 208' and values are determined by controller 220 (FIG. 2A). Z can be determined by averging distances Z1 and Z2 and Ry can be determined based on:

$$Ry = \frac{Z2 - Z1}{L}$$

In other embodiments, signals represent an interferometric measurement based on either intensity, phase, distance, or the like of two related beams (i.e., RSZ1 and RSZ2 or RSZ3 and RSZ4) being compared. A resulting signal from the comparison corresponds to paramaters (e.g., position, orientation, tilt, etc.) of either reticle stage 202 or reticle 204.

With reference to FIG. 3A, the calculation of Z and Ry is as follows for a reticle 204 that lies on or parallel to the Y axis. In regards to Z, Z1 is approximately equal to Z2 because reticle 204 lies on or parallel to the Y-axis. Thus, $Z \approx Z1 \approx Z2$. In regards to Ry, it is substantially zero. This is because, if $Z1 \approx Z2$, then $Z2-Z1 \approx 0$.

With reference to FIG. 3B, the calculation of Z and RY is as follows for a reticle that is rotated Ry around the Y axis. In regards to Z, it is equal to $(Z1+Z2)/2$, or the average of the two values. In regards to Ry, it is equal to $(Z2-Z1)/L$, as is shown in the equation above.

Therefore, in various embodiments, the four interferometer beams RSZ1–RSZ4 are used to determine two DOF (Z and Ry) of the patterned surface 206 of reticle 204. In these embodiments, Z is a direction about normal to the patterned surface 206 and parallel to the lithographic tool's optical axis. Also, in these embodiments, Ry is a rotation about a scan axis of the reticle stage 202. As described above, two interferometer beams (RSZ1 and RSZ2) reflect off of pattern surface 206 of reticle 204 on either side of the pattern 206. These beams cannot be used during lithographic printing because the reticle stage 202 has to travel (in the scan Y direction shown as an arrow in FIGS. 2A and 2B) further than a physical length of the reticle 204. This causes discontinuous signals from these two interferometer beams (RSZ1 and RSZ2) as the beams run off of a reticle surface. This discontinuity makes accurate stage control in Z and Ry difficult to nearly impossible. Also, other masking functions at the reticle focal plane (framing blades (not shown)) make the use of these two beams (RSZ1 and RSZ2) impractical for control of reticle stage 202 under lithography conditions because the blades will cut off the interferometer beams (RSZ1 and RSZ2) every time a scan is made.

Also, in various embodiments, the other two interferometer beams (RSZ3 and RSZ4) are positioned to reflect off of surfaces on the reticle stage 202. There are numerous options for the configuration of these reflective surfaces. In some embodiments, a first reflective surface (e.g., with point 222) of reticle stage 202 can be oriented in or parallel to the X-Y plane to give Z position feedback. Then, a second reflective surface (e.g., with point 224) of reticle stage 202 can be oriented in or parallel to the X-Y plane. Alternate configurations are possible where the second reflective surface of reticle stage 202 can be oriented in or parallel to a Y-Z plane. Then, the second surface yields Ry stage position information. In further alternative embodiments, various other orientations exist where calculations would yield Z and Ry values. The lithographic tool would typically look at the difference between two interferometers (e.g., dual interferometer 210 or interferometers 210A' and 210B') with separation in either the X or Z directions, thus giving Ry information.

Figure 4:
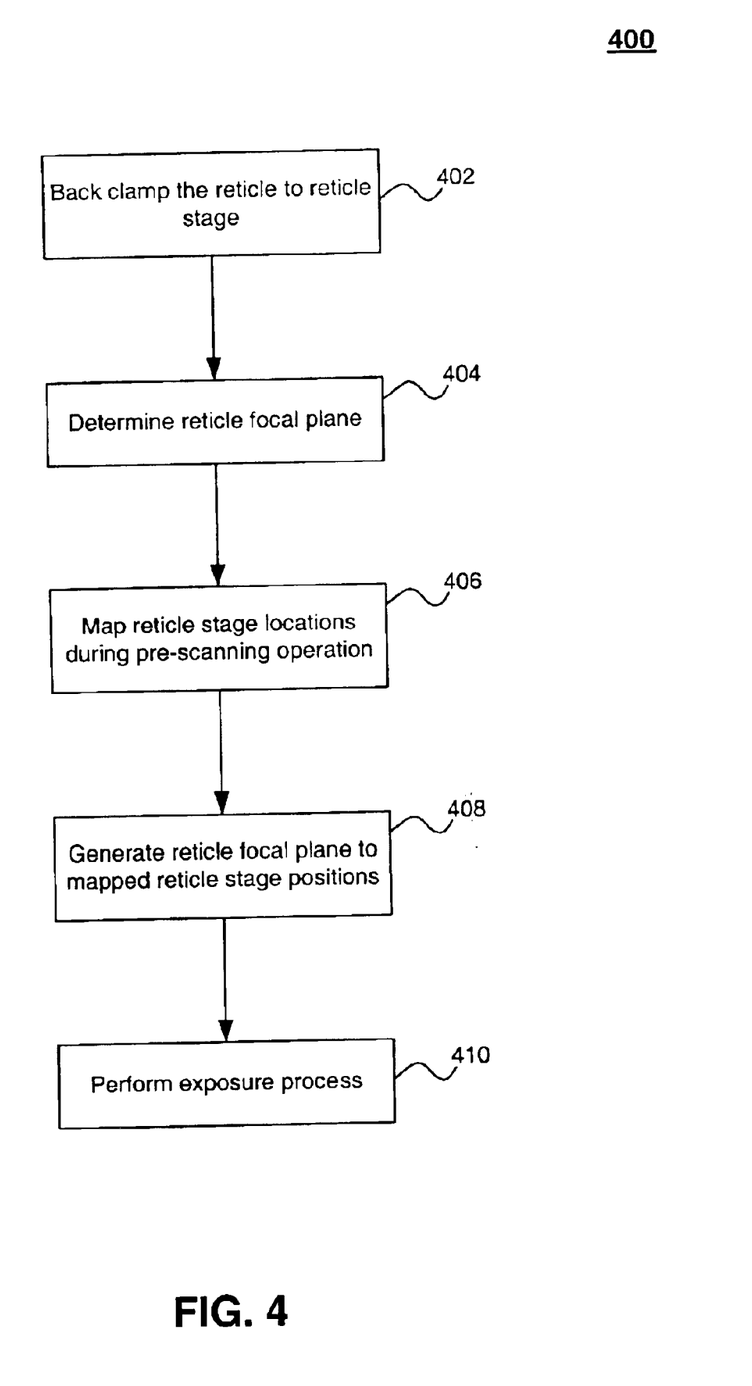
FIG. 4 shows a flowchart of an overall measuring and controlling method for a lithography tool according to embodiments of the present invention.
Figure 5:
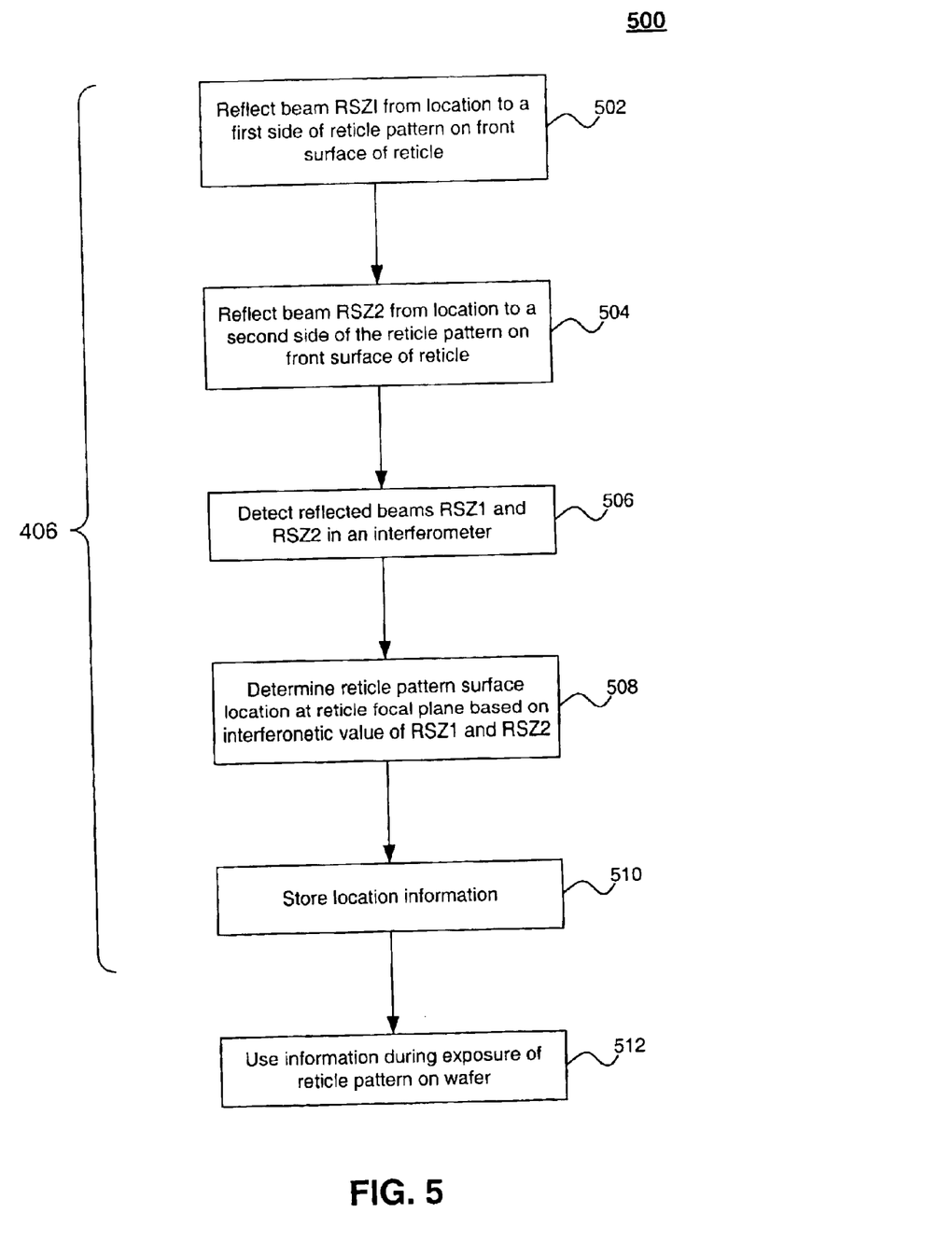
FIG. 5 shows a flowchart of a measuring and controlling method for a reticle according to embodiments of the present invention.
Figure 6:
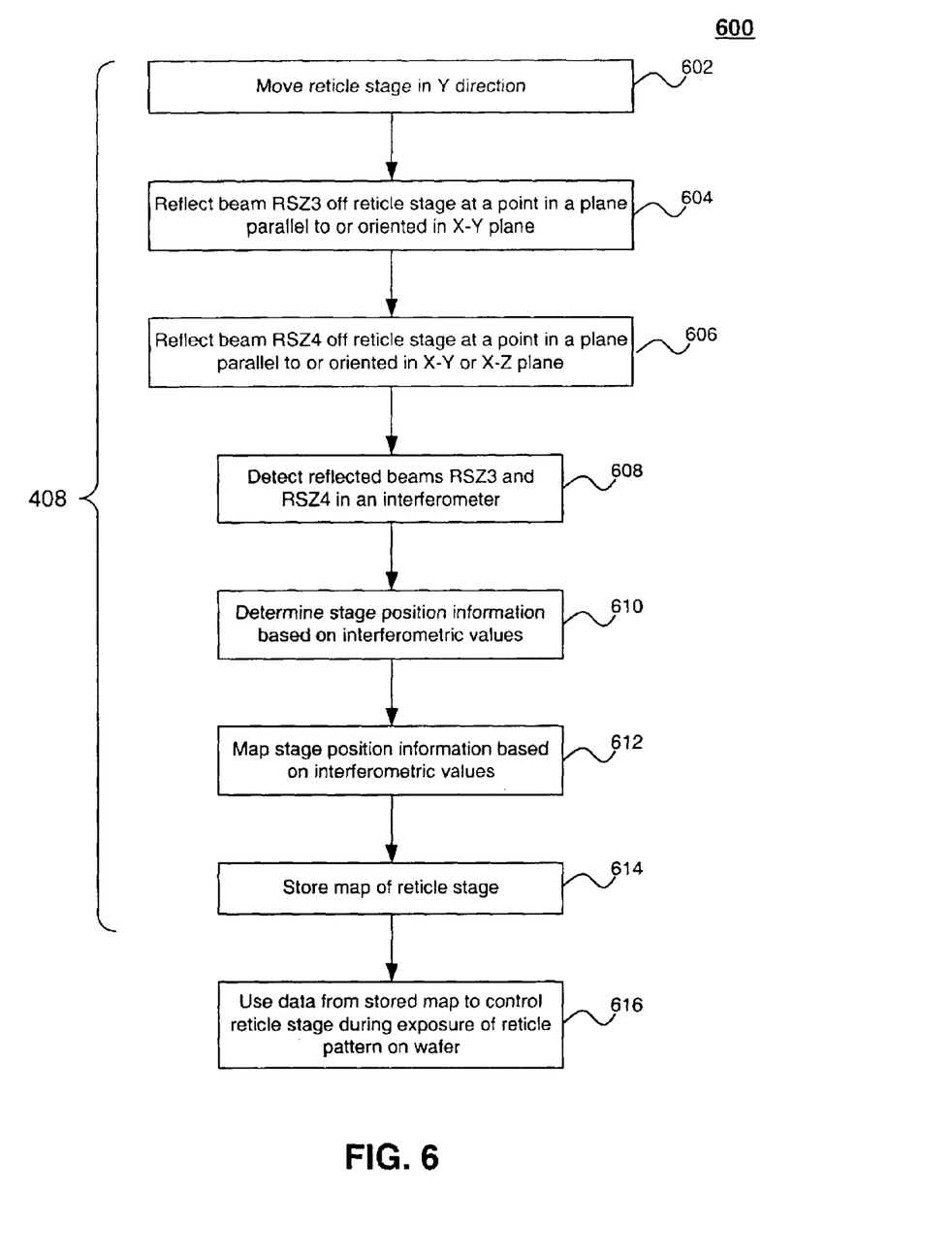
FIG. 6 shows a flowchart of a measuring and controlling method for a reticle stage according to embodiments of the present invention.

FIGS. 4–6 show flowcharts of methods 400, 500, and 600 according to embodiments of the present invention. A summary of those methods follows. After loading reticle 204 (and occasionally during calibration or between calibrations once or periodically) onto reticle stage 202 the data from RSZ1 and RSZ2 can be used to locate the patterned surface 206 at a reticle focal plane established by projection optics (not shown) of the lithography tool or any other desired plane determined by machine setup. Then, while reticle stage 202 is scanned in the Y direction so that reticle 204 remains in the chosen plane, the values of RSZ3 and RSZ4 are recorded and stored as a map. When the lithography tool is ready to do exposures, the data from the map will be used to control the reticle stage 202, and thereby the reticle 204, in Z and Ry so that pattern 206 is always in the chosen plane. Thus, even if beams RSZ1 and RSZ2 are discontinuous due to running off of the reticle 204 at either end of the scans, the stage control is not compromised because the control feedback is coming from beams RSZ3 and RSZ4. In another embodiment, beams RSZ1 and RSZ2 can be constantly monitored during lithography to verify the map and to possibly do continuous updating of the map used for stage Z and Ry control. It is to be appreciated that there are other ways of determining stage position during scanning while maintaining pattern 206 of reticle 204 in a chosen plane, which are all contemplated by the invention.

FIG. 4 depicts a flowchart of method 400 according to embodiments of the present invention (steps 402–410). At step 402, a reticle (e.g., reticle 204) is back clamped to a reticle stage (e.g., stage 202). At step 404, a reticle focal plane is determined based on a first set of interferometric measuring beams (e.g., RSZ1 and RSZ2). At step 406, a map of reticle stage locations is determined during scanning of the reticle stage based on a second set of interferometric measuring beams (e.g., RSZ3 and RSZ4). In step 408, the measured reticle focal plane is correlated to the map of the reticle stage. In step 410, the reticle stage is controlled based on the correlation during exposure of a pattern on the reticle onto a wafer. The exposure is accomplished through processes known in the art.

FIG. 5 depicts a flowchart of method 500 that can occur during step 406 according to embodiments of the present invention. At step 502, a first beam (e.g., RSZ1) is reflected from a location (e.g., point 212) adjacent a first side of a reticle pattern (e.g., pattern 206). At step 504, a second beam (e.g., RSZ2) is reflected from a location (e.g., point 214) adjacent a second side of the reticle pattern. At step 506, the two reflected beams are detected in an interferometer (e.g., interferometer 208 or 208'). At step 508, an interferometric operation is performed (e.g., in controller 220) on the received signals to determine a location of the reticle pattern, and thus the reticle focus plane. At step 510, location information is stored (e.g., in storage 218). At step 512, which can be part of step 410, the location information is used (e.g., by stage controller 228) to control a reticle stage (e.g., stage 202) during an exposure process.

FIG. 6 depicts a flowchart of a method 600 that can occur during step 408 according to embodiments of the present invention. At step 602, a reticle stage (e.g., stage 202) is scanned in a Y direction. At step 604, a first measuring beam (e.g., RSZ3) is reflected off a point (e.g., point 222) on the reticle stage that is parallel to or oriented in an X-Y plane. At step 606, a second measuring beam (e.g., RSZ4) is reflected off a point (e.g., point 224) on the reticle stage that is parallel to or oriented in the X-Y or Y-Z plane. At step 608, the first and second measuring beams are detected by an interferometer (e.g., interferometers 208 or 208'). At step 610, stage position information is determined (e.g., by processor 220) based on interferometric values generated by the interferometer. At step 612, a map is generated (e.g., by controller 220) of the stage position during the scan based on the interferometric values. At step 614, the map is stored (e.g., in storage 218). At step 616, which can be part of step 410, data from the stored map is used (e.g., by stage controller 228) to control the reticle stage during an exposure process.

Figure 7:
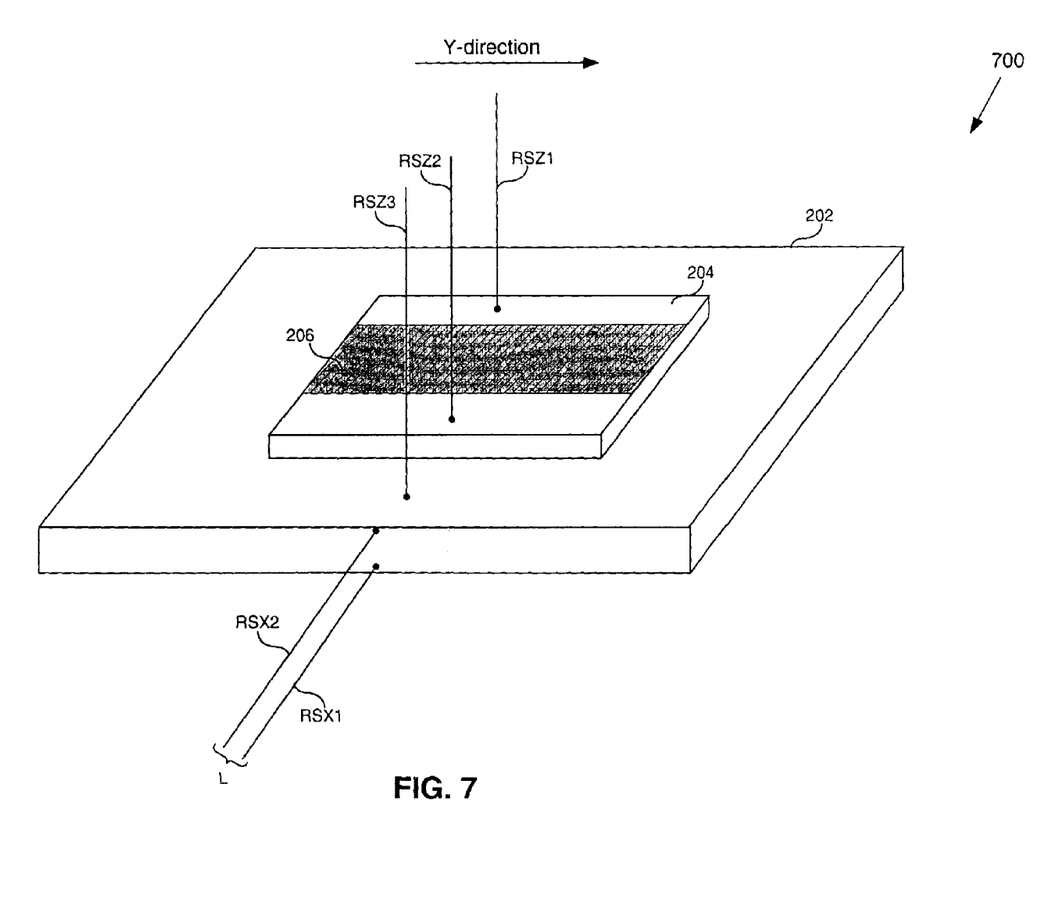
FIG. 7 shows a portion of a lithographic system for measuring reticle and stage positions according to embodiments of the present invention.

FIG. 7 shows a portion 700 of a lithography tool used to measure stage 202 and reticle 204 positions according to embodiments of the present invention. In this embodiment, although not shown, beams RSZ1–RSZ3 and RSX1–RSX2 are produced by and detected by an interferometer similar to 208 or 208' discussed above, or any other interferometer. As discussed above, RSZ1 and RSZ2 are used to determined characteristics about reticle 204 and RSZ3 is used to determine Z of stage 202. RSX1 and RSX2 are used to determined both an X position of stage 202 and Ry. Ry is determined by:

$$Ry = \frac{X2 - X1}{L}$$

Figure 8:
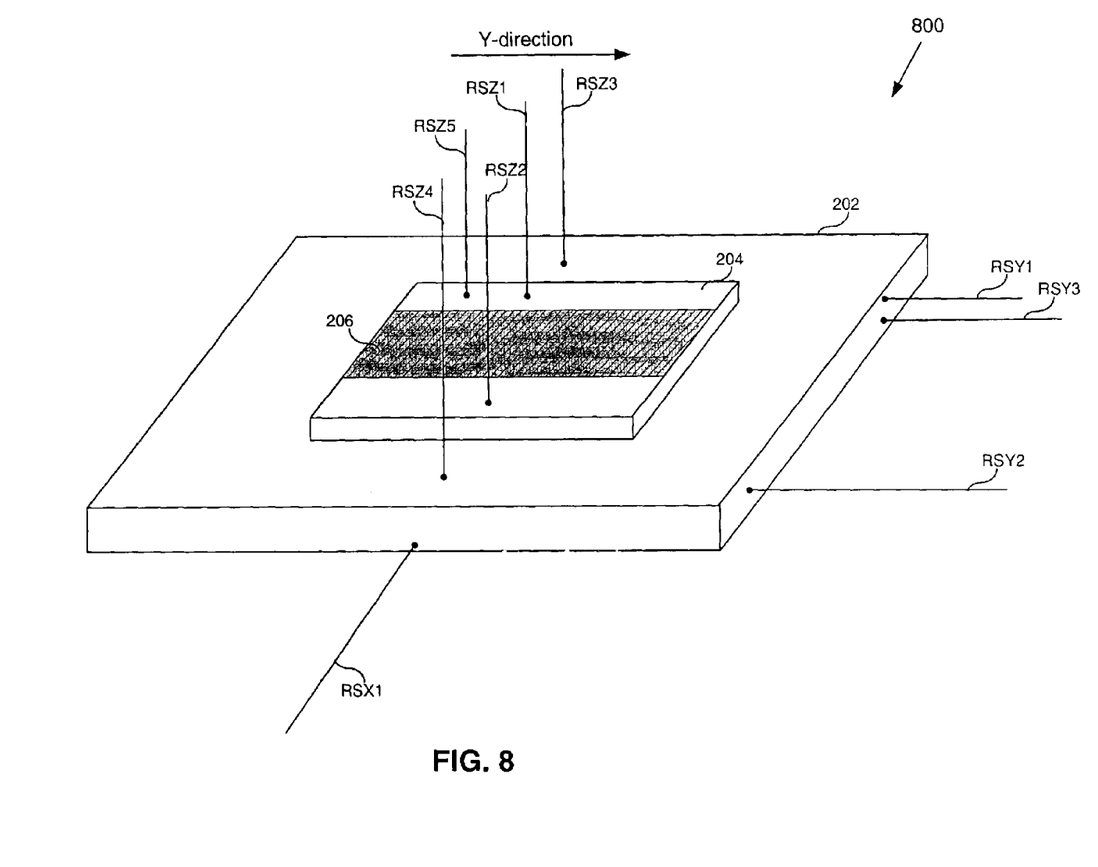
FIG. 8 shows a portion of a lithographic system for measuring reticle and stage positions according to embodiments of the present invention.

FIG. 8 shows a portion 800 of a lithography tool used to measure stage 202 and reticle 204 positions according to embodiments of the present invention. Again, in this embodiment, although not shown, beams RSZ1–RSZ5, RSY1–RSY3, and RSX1 are produced by and detected by an interferometer similar to 208 or 208' discussed above, or any other interferometer. This embodiment shows beams that can enable determination of all six DOF for stage 202 and/or reticle 204. Beams RSZ1 and RSZ2 allow for Z and Ry of reticle 204 to be determined. Beams RSZ1 and RSZ5 allows for Rx of reticle 204 to be determined. Beams RSZ3 and RSZ4 allow for Z and Ry of stage 202 to be determined. Beam RSX1 allows for X of stage 202 to be determined. Beam RSY1, RSY2, and/or RSY3 allow for Y of stage 202 to be determined. Beams RSY2 and RSY3 allow for Rz of stage 202 to be determined. Beams RSY1 and RSY3 allow for Rx of stage 202 to be determined. These determination are made based on the above formulas, similar formulas to the above, or any other known interferometric formulas.

Figure 9A:
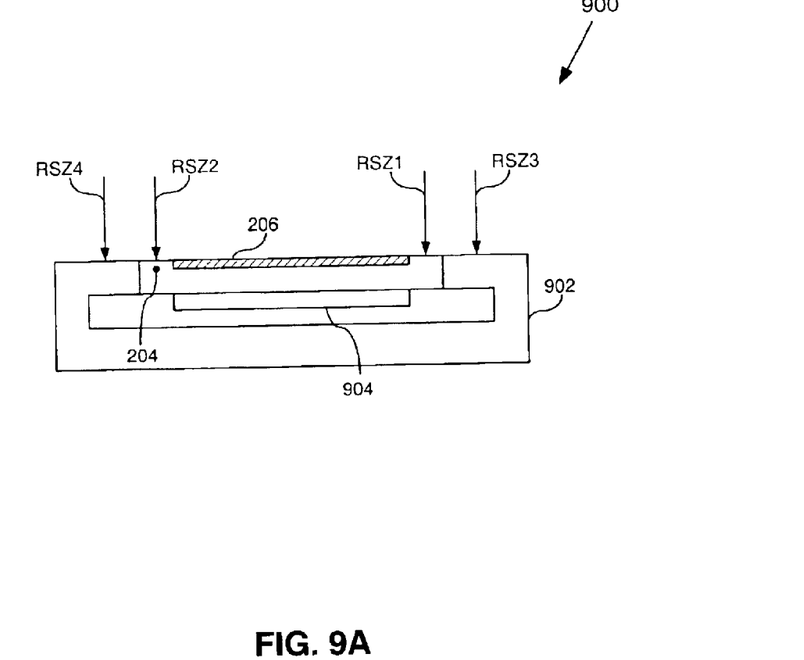
FIG. 9A shows a portion of a lithographic system having a side held reticle according to embodiments of the present invention.

FIG. 9A shows a portion 900 of a lithography tool according to embodiments of the present invention. Portion 900 includes reticle 204 that is clamped at its sides to stage 902. In some embodiments, reticle 204 can be coupled to a support device (e.g., a stiffener) 904 to counteract any warping force on reticle 202. Beams RSZ1–RSZ4 can be used as described above to determine Z and Ry of stage 902 and/or reticle 204.

Figure 9B:
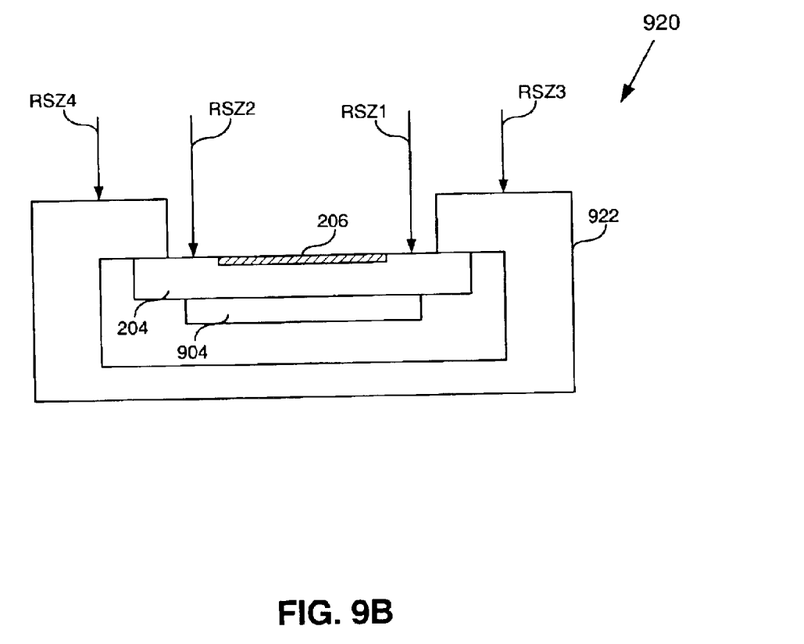
FIG. 9B shows a portion of a lithographic system having a front held reticle according to embodiments of the present invention.

FIG. 9B shows a portion 920 of a lithography tool according to embodiments of the present invention. Portion 920 includes reticle 204 that is front clamped to stage 922. In some embodiments, reticle 204 can be coupled to support device 904 to counteract any warping force on reticle 202. Beams RSZ1–RSZ4 can be used as described above to determined Z and Ry of stage 922 and/or reticle 204.

CONCLUSION

While various embodiments of the present invention have been described above, it should be understood that they have been presented by way of example only, and not limitation. It will be apparent to persons skilled in the relevant art that various changes-in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method comprising the steps of:
   measuring location data of a pattern side of a reticle based on a first set of interferometer measuring beams;
   measuring map data of a reticle stage during scanning of the reticle stage based on a second set of interferometer measuring beams; and
   controlling the reticle stage during exposure of a wafer with a pattern on the pattern side of the reticle based on said location data and said map data.

2. The method of claim 1, wherein said measuring location data step comprises the steps of:
   reflecting a first beam of the first set of beams from a point adjacent a first side of the pattern on the reticle; and
   reflecting a second beam of the first set of beams from a point adjacent a second side of the pattern on the reticle.

3. The method of claim 1, wherein said measuring map data step comprises the steps of:
   reflecting a first beam of the second set of beams from a point in a plane parallel to an X-Y plane of the reticle stage; and
   reflecting a second beam of the second set of beams from a point in a plane parallel to the X-Y plane of the reticle stage.

4. The method of claim 1, wherein said measuring map data step comprises the steps of:
   reflecting a first beam of the second set of beams from a point in a plane parallel to an X-Y plane of the reticle stage; and reflecting a second beam of the second set of beams from a point in a plane parallel to a Y-Z plane of the reticle stage.

5. The method of claim 1, wherein said measuring map data step comprises the steps of:
   reflecting a first beam of the second set of beams from a point in a plane parallel to an X-Y plane of the reticle stage; and
   reflecting a second beam of the second set of beams from a point in a plane oriented in the X-Y plane of the reticle stage.

6. The method of claim 1, wherein said measuring map data step comprises the steps of:
   reflecting a first beam of the second set of beams from a point in a plane parallel to an X-Y plane of the reticle stage; and
   reflecting a second beam of the second set of beams from a point in a plane oriented in a Y-Z plane of the reticle stage.

7. The method of claim 1, wherein said measuring map data step comprises the steps of:
   reflecting a first beam of the second set of beams from a point in a plane oriented in an X-Y plane of the reticle stage; and
   reflecting a second beam of the second set of beams from a point in a plane parallel to the X-Y plane of the reticle stage.

8. The method of claim 1, wherein said measuring map data step comprises the steps of:
   reflecting a first beam of the second set of beams from a point in a plane oriented in an X-Y plane of the reticle stage; and
   reflecting a second beam of the second set of beams from a point in a plane parallel to a Y-Z plane of the reticle stage.

9. The method of claim 1, wherein said measuring map data step comprises the steps of:
   reflecting a first beam of the second set of beams from a point in a plane oriented in an X-Y plane of the reticle stage; and
   reflecting a second beam of the second set of beams from a point in a plane oriented in the X-Y plane of the reticle stage.

10. The method of claim 1, wherein said measuring map data step comprises the steps of:
    reflecting a first beam of the second set of beams from a point in a plane oriented in an X-Y plane of the reticle stage; and
    reflecting a second beam of the second set of beams from a point in a plane oriented in a Y-Z plane of the reticle stage.

11. The method of claim 1, wherein said measuring location data step comprises the steps of:
    determining a degree of freedom in a Z direction of the pattern side of the reticle, wherein the Z direction is normal to the pattern side of the reticle; and
    determining a degree of freedom for an Ry rotation of the pattern side of the reticle, wherein the Ry rotation is about a scan axis of the reticle stage.

12. The method of claim 1, further comprising the step of determining a reticle focal plane based on said measuring location data step.

13. The method of claim 12, further comprising the steps of:
    correlating the reticle focal plane to said measured map data of the reticle stage; and
    tracking a position of the pattern side of the reticle based on said correlating step during said exposure of the wafer.

14. The method of claim 1, further comprising the step of determining a predetermined reticle plane based on said measuring location data step.

15. The method of claim 14, further comprising the steps of:
    correlating the predetermined reticle plane to said measured map data of the reticle stage; and
    tracking a position of the pattern side of the reticle based on said correlating step during said exposure of the wafer.

16. The method of claim 1, wherein said measuring location data step is performed once between calibrations.

17. The method of claim 1, wherein said measuring location data step is performed periodically between calibrations.

18. The method of claim 1, wherein said measuring location data step is performed continuously.

19. A method comprising the steps of:
    determining a plane of a clamped reticle on a reticle stage using a first interferometer;
    determining positions of the reticle stage during scanning of the reticle stage using a second interferometer;
    correlating the plane to the positions of the reticle stage; and
    controlling the reticle stage during an exposure process based on said correlating step.

* * * * *